United States Patent
Mohan et al.

(10) Patent No.: US 11,545,987 B1
(45) Date of Patent: Jan. 3, 2023

(54) TRAVERSING A VARIABLE DELAY LINE IN A DETERMINISTIC NUMBER OF CLOCK CYCLES

(71) Applicant: Marvell Asia Pte, Ltd., Singapore (SG)

(72) Inventors: Nitin Mohan, Northborough, MA (US); Vasudevan Kandadi, Southborough, MA (US); Thucydides Xanthopoulos, Watertown, MA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/709,367

(22) Filed: Dec. 10, 2019

Related U.S. Application Data

(60) Provisional application No. 62/778,386, filed on Dec. 12, 2018.

(51) Int. Cl.
*H03L 7/10* (2006.01)
*G06F 1/12* (2006.01)
*G06F 1/10* (2006.01)
*G06F 1/08* (2006.01)

(52) U.S. Cl.
CPC ............... *H03L 7/105* (2013.01); *G06F 1/08* (2013.01); *G06F 1/10* (2013.01); *G06F 1/12* (2013.01)

(58) Field of Classification Search
CPC ... H03L 7/105; G06F 1/08; G06F 1/10; G06F 1/105; G06F 1/12; G06F 5/06–16
See application file for complete search history.

(56) References Cited

U.S. PATENT DOCUMENTS

| | | | |
|---|---|---|---|
| 5,260,842 A * | 11/1993 | Leake | G11B 20/1403 |
| 6,285,230 B1 | 9/2001 | Na | |
| 6,600,345 B1 | 7/2003 | Boutaud | |
| 6,686,785 B2 | 2/2004 | Liu et al. | |
| 7,145,831 B2 * | 12/2006 | Goller | G11C 8/04 365/154 |
| 7,551,909 B1 | 6/2009 | Moon et al. | |
| 7,764,095 B2 | 7/2010 | Werner et al. | |
| 7,952,404 B2 | 5/2011 | Petrie | |
| 7,971,088 B2 | 6/2011 | Jung | |

(Continued)

OTHER PUBLICATIONS

Senger, et al., "Low-Latency, HDL-Synthesizable Dynamic Clock Frequency Controller with Self-Referenced Hybrid Clocking," IEEE, ISCAS 2006.

(Continued)

*Primary Examiner* — Patrick C Chen
(74) *Attorney, Agent, or Firm* — Hamilton, Brook, Smith & Reynolds, P.C.

(57) ABSTRACT

In an embodiment, a method includes initializing an input clock rotating register by sending a reset signal synchronized to an input clock signal and initializing an output clock rotating register by sending the reset signal synchronized to an output clock signal. The method further providing a data input synchronized to the output clock to a plurality of mux-flops. The output clock rotating register activates one of the plurality of mux-flops to receive the data input. The method further includes forwarding the data input via the one of the plurality of mux-flops to a multiplexer. The multiplexer has a selection input of the input clock rotating register. The method further includes selecting the data input as the output of the multiplexer to be a data output signal, such that the data output is synchronized with the input clock.

20 Claims, 4 Drawing Sheets

(56) References Cited

U.S. PATENT DOCUMENTS

| | | |
|---|---|---|
| 9,425,779 B2 | 8/2016 | Jung |
| 9,654,121 B1 | 5/2017 | Chu |
| 10,162,373 B1 | 12/2018 | Chong et al. |
| 10,530,370 B1 | 1/2020 | Mohan et al. |
| 10,784,871 B1 | 9/2020 | Xanthopoulos et al. |
| 10,784,874 B1 | 9/2020 | Xanthopoulos |
| 11,402,413 B1 | 8/2022 | Mohan et al. |
| 2002/0079937 A1 | 6/2002 | Xanthopoulos |
| 2002/0097592 A1 | 7/2002 | Komurasaki |
| 2004/0017234 A1 | 1/2004 | Tam et al. |
| 2007/0170967 A1 | 7/2007 | Bae |
| 2007/0194815 A1 | 8/2007 | Nelson |
| 2012/0068748 A1 | 3/2012 | Stojanovic et al. |
| 2013/0238309 A1 | 9/2013 | Ting et al. |
| 2014/0195081 A1* | 7/2014 | Kwak .................. B60L 53/18 701/22 |
| 2014/0327478 A1 | 11/2014 | Horng et al. |
| 2014/0347107 A1 | 11/2014 | Kim |
| 2015/0162921 A1 | 6/2015 | Chen et al. |
| 2015/0213873 A1 | 7/2015 | Joo |
| 2015/0277393 A1* | 10/2015 | Liu .................. G01R 31/31725 307/129 |
| 2015/0326231 A1* | 11/2015 | Thinakaran .......... H03K 3/0315 331/25 |
| 2016/0013796 A1 | 1/2016 | Choi |
| 2016/0077572 A1 | 3/2016 | Chang |
| 2016/0351269 A1 | 12/2016 | Okuna |
| 2018/0351770 A1 | 12/2018 | Chiu |
| 2019/0007055 A1 | 1/2019 | Nelson |
| 2020/0044657 A1 | 2/2020 | Pi et al. |
| 2020/0076439 A1 | 3/2020 | Weeks et al. |
| 2020/0076440 A1 | 3/2020 | Ng et al. |
| 2020/0083891 A1 | 3/2020 | Huh et al. |

OTHER PUBLICATIONS

Sidiropoulos, et al., "A Semidigital Dual Delay-Locked Loop," IEEE Journal of Solid-State Circuits, vol. 32, No. 11, Nov. 1997.

Zoni, et al., "A DVFS Cycle Accurate Simulation Framework with Asynchronous NoC Design for Power-Performance Optimizations," J. Sign. Process Syst., published online Mar. 24, 2015.

U.S. Appl. No. 16/528,311, entitled "DLL-Based Clocking Architecture with Programmable Delay at Phase Detector Inputs", filed Jul. 31, 2019.

U.S. Appl. No. 16/704,483, entitled "Droop Detection and Mitigation", filed Dec. 5, 2019.

* cited by examiner

TRAVERSING A VARIABLE DELAY LINE IN A DETERMINISTIC NUMBER OF CLOCK CYCLES

RELATED APPLICATION

This application claims the benefit of U.S. Provisional Application No. 62/778,386, filed on Dec. 12, 2018.

The entire teachings of the above application are incorporated herein by reference.

BACKGROUND

Processors typically include a root clock to generate clock signals for the chip. However, lines carrying the clock signal from the root clock to other components can introduce delay. Variable delay lines can be used on a chip to introduce delay as needed.

SUMMARY

In an embodiment, a method includes initializing an input clock rotating register by sending a reset signal. The reset signal received by the input clock rotating register is synchronized to an input clock signal. The method further includes initializing an output clock rotating register by sending the reset signal. The reset signal received by the output clock rotating register is synchronized to an output clock signal. The method further provides a data input synchronized to the output clock to a plurality of mux-flops. The output clock rotating register activates one of the mux-flops to receive the data input. The method further includes forwarding the data input via the one of the mux-flops to a multiplexer. The input clock rotating register controls the multiplexer (e.g., controls selecting an output of the multiplexer). The method further includes selecting the data input as the output of the multiplexer to be a data output signal, such that the data output is synchronized with the input clock.

In an embodiment, the method may include synchronizing the reset signal to the input clock signal by routing the reset signal through a first flop that uses the input clock signal and synchronizing the reset signal to the output clock signal by routing the reset signal through a second flop that uses the output clock signal.

In an embodiment, a number of flops in the input clock rotating register and a number of flops in the output clock rotating register may be equal. Each mux-flop may be coupled to be activated to receive the data input by a particular flop of the input clock rotating register, and each mux-flop may be coupled to output to a particular input of the multiplexer.

In an embodiment, upon sending the reset signal, the input clock signal and output clock signal have a period longer than that of the reset signal. The method further comprises after sending the reset signal, increasing the frequency of the input clock signal and the output clock signal.

In an embodiment, initializing the input clock rotating register and initializing the output clock rotating register further includes setting values of the output clock rotating register such that, in a given clock cycle, one mux-flop of the mux-flops receives the data input signal and setting values of the input clock rotating register such that, in a given clock cycle, the multiplexer outputs a value stored by a mux-flop loaded according to an offset number of cycles.

In an embodiment, the offset is equal to one fewer than a number of the mux-flops.

In an embodiment, the data output signal is provided through a Joint Test Action Group (JTAG) interface.

In an embodiment, a system includes an input clock rotating register configured to be initialized by a reset signal. The reset signal received by the input clock rotating register is synchronized to an input clock signal. The system further includes an output clock rotating register configured to be initialized by the reset signal. The reset signal received by the output clock rotating register is synchronized to an output clock signal. The system further includes a plurality of mux-flops configured to receive a data input synchronized to the output clock. The output clock rotating register activates one of the mux-flops to receive the data input. The system further includes a multiplexer configured to receive the data input, via the one of the mux-flops. The multiplexer receives a selection input of the input clock rotating register, where the multiplexer selects the data input as the output of the multiplexer to be a data output signal, such that the data output is synchronized with the input clock.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
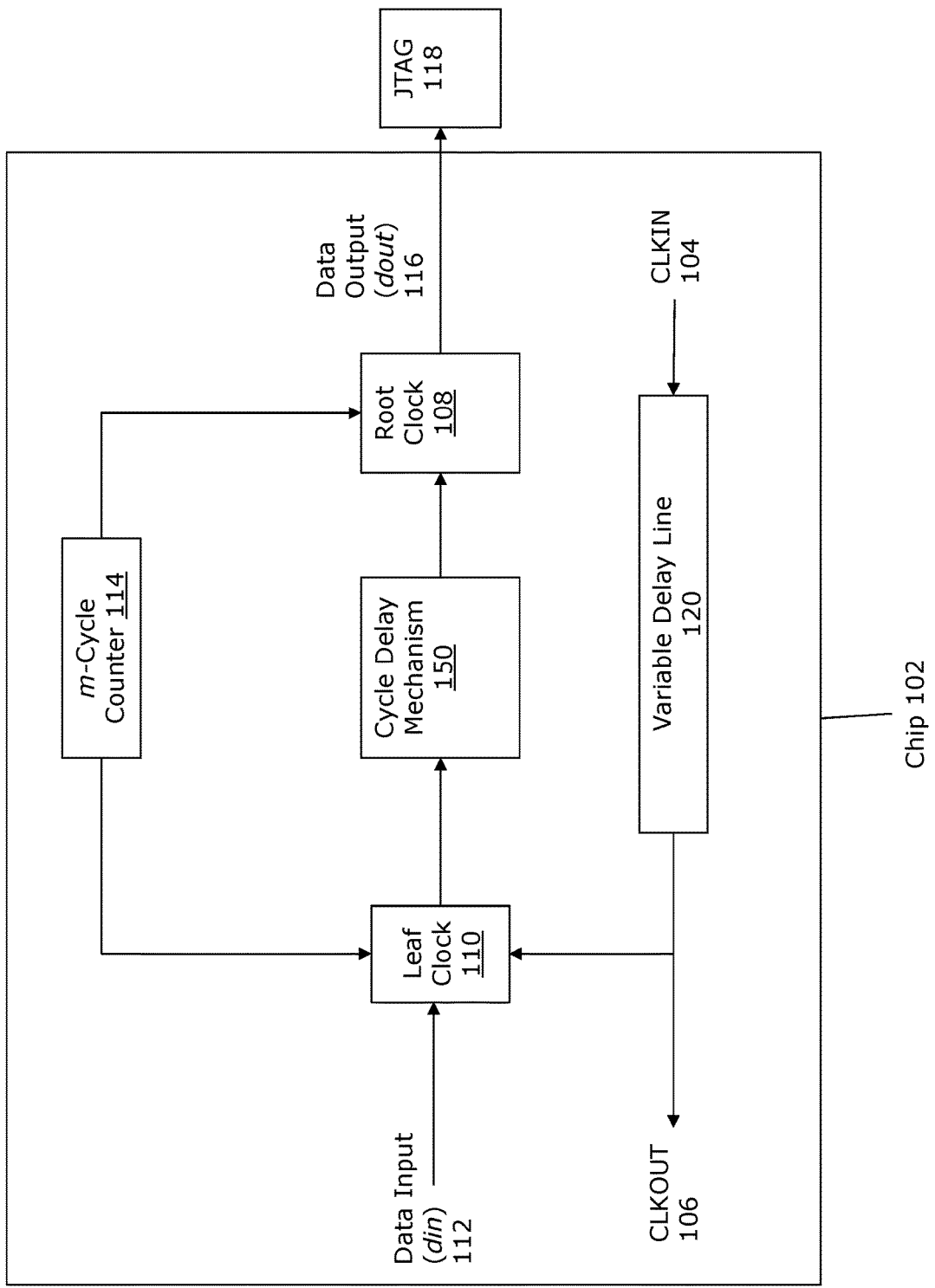
FIG. 1 is a high-level block diagram illustrating an example embodiment of a chip employing a cycle delay mechanism.

A description of example embodiments follows.

In an embodiment, the present disclosure improves debugging a problem in a chip design. After a chip is printed in silicon, debugging is often employed to determine what happened exactly at the moment when an error occurs (e.g., variable/register values). To initiate debugging, the clock of the chip is stopped. Upon stopping the clock of the chip, all values on the chip are dumped with a scan/scandump. The scan/scandump dumps (e.g., copies) the values of all the flops into a file (e.g., software file) or other memory structure. The scandump can output the dump via a port (e.g., JTAG (Joint Action Test Group)) or multiple ports, in one example. For example, the output port of the chip can be observed through a standard JTAG port, and diagnostics can process the file later. In short, it is desirable to stop the chip after a designated number of cycles (e.g. set by a counter) and get every binary value on the chip in every flop or other memory device. However, as soon as the debug counter expires, the clock should stop precisely at that moment for all flops on the chip. Therefore, the present disclosure solves the problem of stopping the clock for the same cycle at different parts of the chip.

Modern clocking systems often require controlling the root-clock logic using a signal on leaf-clock in a cycle-precision manner. For example, a counter running on the leaf-clock may trigger change in the root clock behavior (e.g., stop clock, shrink phase/cycle, divide clock, etc.) after a fixed number of cycles. In such scenarios, the signal traverses the clock tree (e.g., from leaf to root) in a fixed number of cycles. Depending on the design, the number of cycles may be arbitrary. The signal traversing the clock tree is typically monitored by placing flops within the clock trees. These flops are clocked using intermediate nodes of the clock distribution network such that they meet all timing constraints (e.g., setup/hold checks). Implementing this scheme in DLL-based clock architectures can be challenging when the signal traverses through a variable delay line. Depending on the dynamic range of the delay line, no flop-to-flop delay can meet both setup and hold requirements for full delay settings range of the delay line.

Typically, a phase-locked loop (PLL) signal originates from a root (e.g. root node), and the PLL signal branches from the root to other elements along a tree or spine. The root clock is connected to nodes, and leaf nodes are the actual design of the chip. Ideally, the tree dispenses the clock to be at the exact same time at each of the leaf nodes of the tree. Wire length can impact the distribution of the clock signal because the clock takes longer to propagate on a longer route than a shorter route. Therefore, in designing the chip, the route to certain points on a chip may be longer to make sure the clock is the same at each level of the tree, and that the delay is the same for all leaf nodes.

In the present disclosure, a first-in-first-out (FIFO) structure uses an arbitrary but a fixed number of cycles to traverse a variable delay line. Here, din is the data input on the output clock of the delay line (clkout). The data input needs to traverse to dout (on clkin) in a fixed number of cycles.

A counter can stop the clock on the chip, or signal when output is to be read from all nodes/registers on the chip. The counter is connected to the leaf clock, and therefore counts leaf clock cycles. In an embodiment, software can load a number of cycles into the counter. When the counter reaches zero, the clock stops. However, one problem is that the counter might stop at the wrong cycle because the leaf clock is a delayed version of the root clock.

In an embodiment, to solve this problem, flip flops are placed inside the clock tree inside the distribution. The flip flops represent intermediate clocks between the root and leaf clocks along the clock tree. The flip flops are not exposed to the outside world or exposed at any other level.

In a large chip, it can be difficult to distribute the clock in the whole chip without problems like variation or too much delay. A common solution is to divide the chip into smaller grids, however, floor plan limitations of the chip might force a design to have smaller trees in some locations and larger trees in others.

A delay-locked loop (DLL) is a feedback loop. For example, to match two clocks, Clock 0 and Clock 1, Clock 1 can be fed into a circuit element called a phase detector and compared to a reference clock. If the phase detector detects the input clock is different from the reference clock, it can output whether the clock is early or late. Therefore, a variable delay line can be introduced that can change the delay of a line without making the line physically longer, which, as noted above, can be limited by physical space on the chip. A variable delay line is placed between a root clock and a leaf clock, with intermediary distributions able to be placed in between. With the variable delay line, the delay can be changed to synchronize clocks of different parts (e.g., physical areas) of the chip. If one tree of the clock is faster, the variable delay line can be adjusted to synchronize the leaf nodes.

The problem with a variable delay line is that the delay can be larger than a cycle or small. If the delay switches between these magnitudes, internally, that switch is between versions of the clock. With a delay line, there is no intermediate clock because it varies with the delay settings. If variation is more than a cycle, instead of having a one-cycle path, a multiple cycle (e.g., 4-cycle) path can be created.

FIG. 1 is a high-level block diagram 100 illustrating an example embodiment of a chip 102 employing a cycle delay mechanism 150. The chip 102 has a root clock (CLKIN) 104 that is coupled with a variable delay line 120 that outputs a leaf clock (CLKOUT) 106. A cycle delay mechanism 150 is configured to receive data input (din) on the leaf clock 110. The cycle delay mechanism outputs the data on a root clock 108 as data output (dout) 116.

To debug the chip, a designer can set a counter to stop the chip at a certain cycle. Likewise, a m-cycle counter 114 is configured to allow the chip 102 to run for m cycles before outputting the data input 112 signal. The cycle delay mechanism 150 allows the data to be observed when the leaf clock and root clock are at the same cycle count. The data output (dout) 116 signal can be read off the chip via a JTAG interface 118, as a person having ordinary skill in the art can understand.

Figure 2:
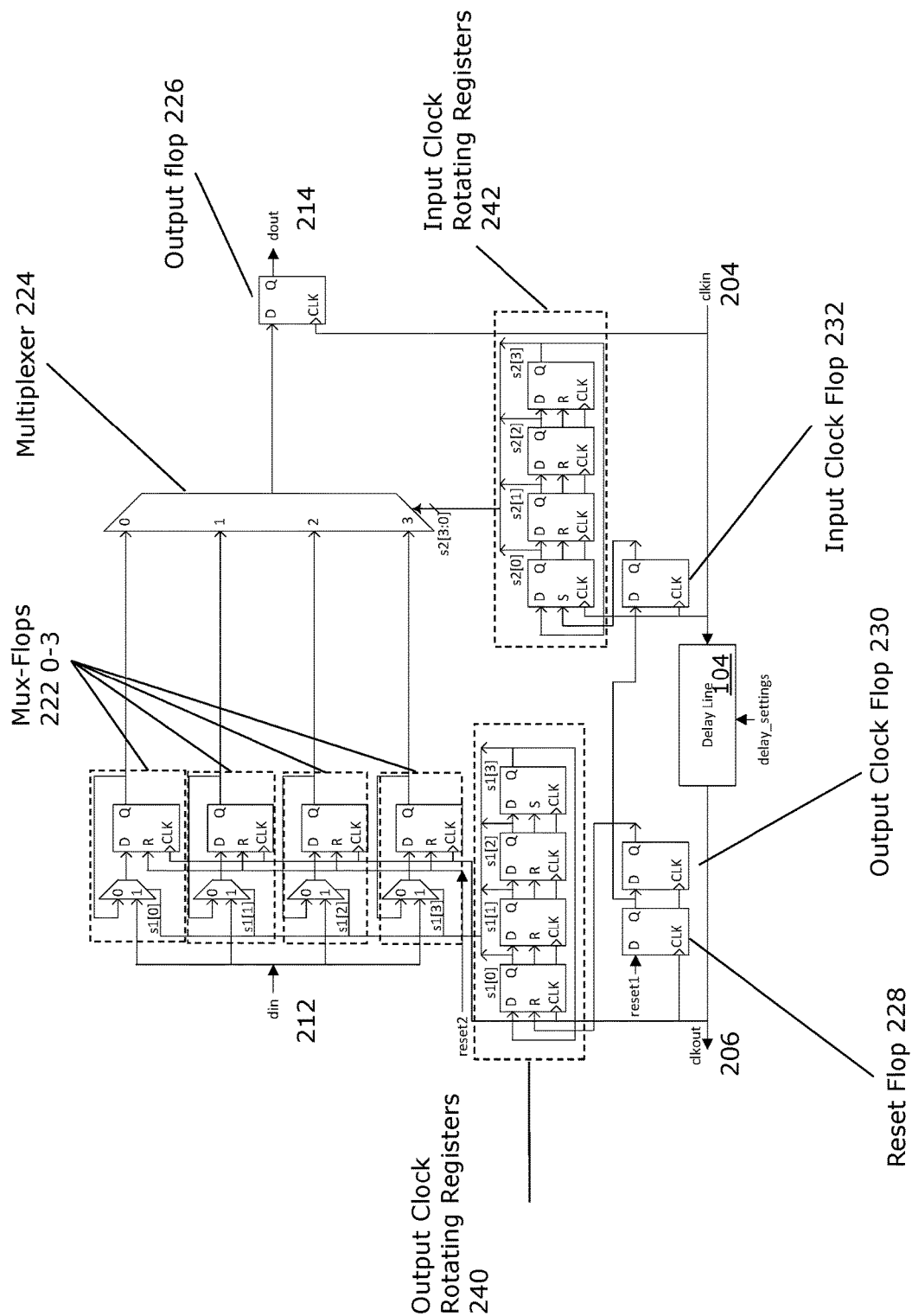
FIG. 2 is a block diagram illustrating an example embodiment of the present disclosure.

FIG. 2 is a block diagram 200 illustrating an example embodiment of the present disclosure. A variable delay line 104, configured by delay settings (e.g., number of seconds/cycles to delay) receives a root clock (CLKIN) 204 and outputs a leaf clock (CLKOUT) 206. In an embodiment, a variable delay line can include multiple MUXes (e.g., 64 MUXes) where each output is coupled to a respective different delay line (e.g., 64 total delay lines). A finite state machine (FSM) can be configured to determine an ideal delay time, and can also output whether a clock is early or late related to another clock. The FSM, based on input from a phase detector, can control delay line. A circuit designer knows how much delay it can introduce and design the delay line module (e.g., a transverser) based on the clock cycles required. The designer should plan for worst case scenario based on how big delay line is.

A reset signal (reset1) can be sent to a reset flop 228, which causes an output clock flop 230 and input clock flop 232 to synchronize the reset signal to the respective output clock 206 and input clock 204. The reset signal is part of the chip initialization/start-up, while the chip is running in low-frequency. During the low-frequency period, the reset signal is sent and the clock is de-asserted at this low frequency. Once the clock speeds up, the counter can start.

Upon initialization of the chip, the reset signal sets respective flops of input clock rotating register 242 and output clock rotating register 240 to respective default values. A rotating register can also be referred to as a recirculating register. The values of each respective flop are configured such that data output (dout) 214 from the output flop 226 is delayed an appropriate number of cycles. The configuration of default values is discussed further below.

After the reset is deasserted, the values of each register rotate. For example, the output clock rotating register begins with a 4'b1000 pattern, with S1[0] and s1[1]-s[3] being '0'. After the reset is deasserted, every clock cycle, the '1' value shifts from s1[0] to s1[1] to s1[2] to s1[3] and then back to s1[0], when it can repeat. The '0' bit values also shift in a similar manner.

Each flop of the output clock rotating register 240 is connected to activate a respective mux-flop 222. For example, flop s1[0] is coupled to mux-flop 0, flop s1[1] is coupled to mux-flop 1, flop s1[2] is coupled to mux-flop 2, and flop s1[3] is coupled to mux-flop 3. Individually, each mux-flop 222 includes a 2-to-1 multiplexer and a flop. The clock port of the flop is coupled to the output clock 206, the reset port of the flop is coupled with the output reset signal, and the data port of the flop is coupled with the output of the 2-to-1 multiplexer. The multiplexer receives its data input on its '0' port from the output port (Q) of the flop and receives its data input on the '0' point form the din signal. The multiplexer selects the input from the output value of the rotating register it is coupled with. Therefore, when the value of the rotating register is '1', (din) is passed to the respective flop. The flop retains that value until the rotating register again has a '1' value, or it is reset.

Meanwhile, the multiplexer 224 receives the outputs of each mux-flop 222. As the mux-flops are configured to retain the data until receiving a new '1' bit from the output clock rotating registers 240, the multiplexer 224 retains values from each mux-flop 222 until they change. For example, in the embodiment illustrated in FIG. 2 having four flops in each respective rotating register 240 and 242, the multiplexer holds the most recent four cycles of data in (din) values. As a general rule, if the system is modified to include a different number n of flops in the respective rotating registers, the multiplexer holds the most recent n cycles of data in (din). As n is adjusted, the multiplexer 224 becomes an n:1 multiplexer.

Likewise, the rotating registers are configured so that the output of the multiplexer 224 to the output flop 226 (e.g., dout 214) is offset by n−1 cycles. For example, the output clock rotating register 240 (s1[3:0]) initializes to a 4'b1000 pattern and shifts (e.g., from s1[3]→s1[0]→s1[1]→s1[2]→s1[3] and so on) at every positive edge of clkout. This register controls the behavior of the four multiplexer-flops (mux-flops) 222. If the bit received by a mux-flop is '1', it samples din. Otherwise, it retains its original state. Due to recirculation, each mux-flop receives '1' every 4th cycle.

Figure 3:
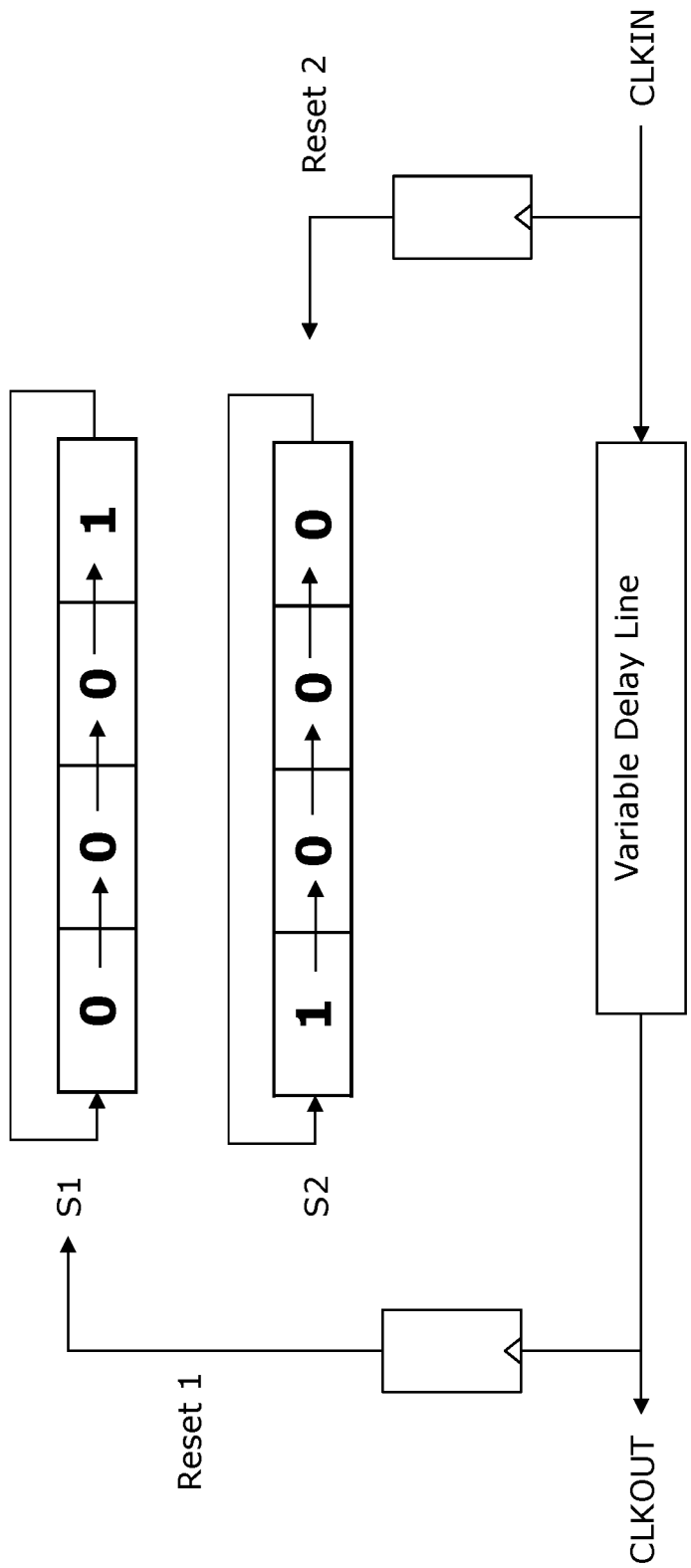
FIG. 3 is a diagram illustrating an example embodiment of operation of a rotating or recirculating register.

FIG. 3 is a diagram 300 illustrating an example embodiment of operation of a rotating or recirculating register. After receiving reset signals synced to CLKIN 304 and CLKOUT 306, respectively, the values of the input clock rotating register 342 and the output clock rotating register 340 rotate as illustrated in FIG. 3.

Referring to FIG. 2, the outputs of these mux-flops 222 are forwarded to a 4:1 multiplexer 224, and the output of the multiplexer 224 is selected by the input clock rotating/recirculating register (s2[3:0]). This register initializes to 4'b0001 pattern and shifts (e.g., from s2[0]→s2[1]→s2[2]→s2[3]) at every positive edge of clkin. A person having ordinary skill in the art can recognize that the '0' bits of the input clock rotating/recirculating register shift in a similar manner. The output of the multiplexer is sampled by a flop on clkin. The 3-cycle (e.g., n−1) offset between the two recirculating registers ensures that the traversal from din to dout is always four (e.g., n) cycles, in this embodiment, regardless of the variable delay line settings. For example, mux-flop 3 (s1[3]) samples din in cycle 1, but s2[3] selects this value only in cycle 4.

The deterministic number of clock cycles in this scheme are achieved by de-asserting reset on both recirculating registers (s1[3:0] and s2[3:0]) in the same cycle. This can pose challenges if clkin to clkout delay is larger than a clock period. However, powering up the chip at low-frequency and de-asserting the reset when the clock period (e.g., during the low frequency period) is large solves this problem. Subsequently, the clock frequency can be increased as most modern clocking systems support dynamic frequency scaling. Once the two recirculating registers start at a fixed offset, they remain locked at the same offset because clkout and clkin are guaranteed to have the same frequency (clkout is just a delayed version of clkin). The delay in the chip may be on the order of 700 pico seconds, however, the reset signal can be 10 nanoseconds. In general, the chip works by running at a low frequency for a small period of time, locking the DLLs, and then running at a high frequency.

De-asserting the reset occurs upon removing the assert. In other words, de-asserting the reset occurs when the reset signal becomes zero. Upon de-asserting the reset, the bits of the rotating registers 240 and 242 begin to change. To de-assert the reset, S1 and S2 are de-asserted at the same time. When reset is asserted, the value of the reset signal (e.g. reset1) is high. Reset is asserted based on an output clock of the leaf (e.g., leaf clock). When a reset and is sampled by the clock, the output clock rotating register 240 is reset on the output clock (e.g., because it is closer to leaf) and the input clock rotating register 242 is reset on the input clock (e.g., because it is closer to root). Arranging the circuit in this manner keeps the output clock rotating register 240 and input clock rotating register 242 relative to their respective clocks (e.g., clkout 206 and clkin 204), but same relative to the introduced (e.g., variable) delay in between their clocks.

The de-asserting of the reset is performed at a low frequency, using, for example, Dynamic Voltage Frequency Scaling (DVFS). With DVFS, the clock can change frequency as chip is running. During the initial chip read out, the chip is running at a low frequency, so the reset signal ideally should also be at a low frequency. The first edge of the reset signal is Rest 1, and the next edge is Reset 2.

In an embodiment, multiplexers (MUXes) are coupled with flops (S1 and S2) (e.g., mux-flops 222) to determine which bit is a new input. When the mux-flop 222 select is a 1, data is input from the chip. When the reset flops to zero, and then one of the mux-flops 222 receives a 1, the stop clock is sampled.

The flops in output clock rotating register 240 (51 (Select 1)) and input clock rotating register 242 (S2 (Select 2)) are reset to reset values. Upon reset, the values are the same for each respective flop within S1 or S2, but S1's reset values are different from S2's reset values. The values in each sets of flops are offset from each other by the maximum number of cycles. For example, the offset of bits in the flops=n−1 where n is the number of flops. Number of cycles is n−1 where n is number of flops. In an embodiment, n=5, however a person having ordinary skill in the art can recognize the number of flops can be adjusted.

Figure 4:
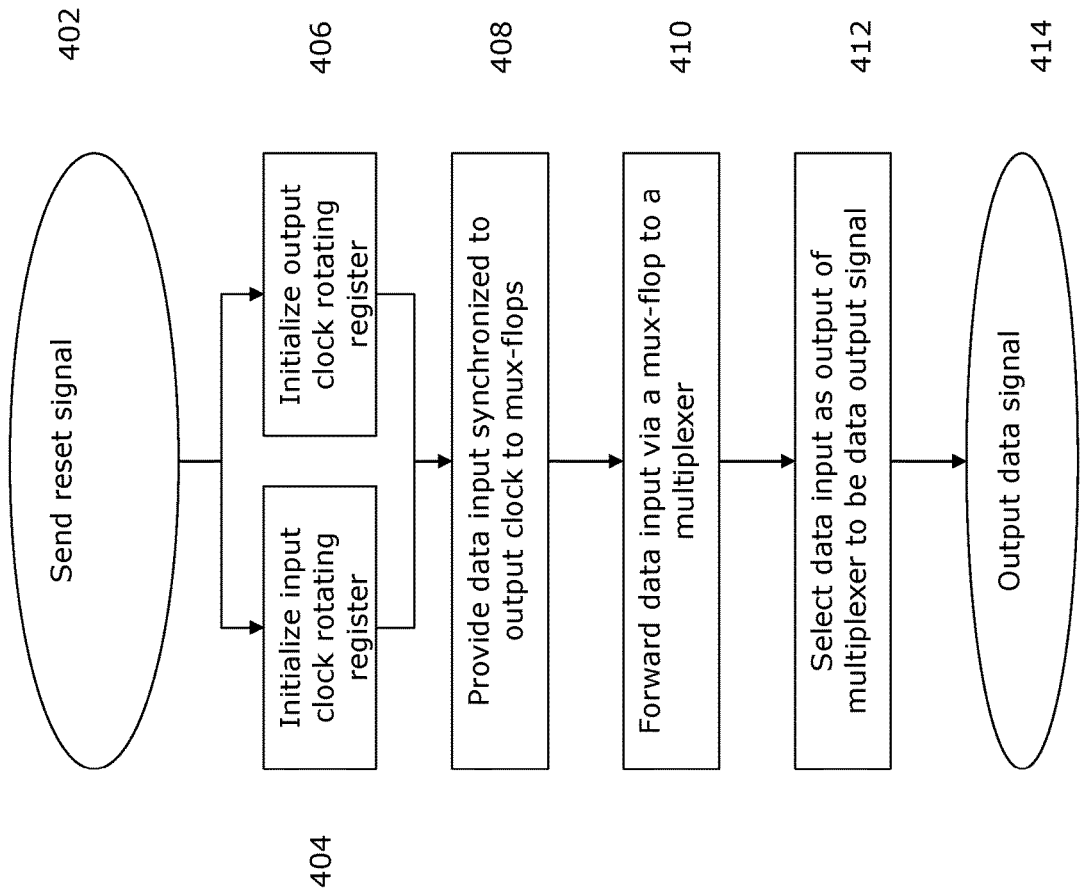
FIG. 4 is a flow diagram illustrating an example embodiment of a method employed by the present disclosure.

FIG. 4 is a flow diagram 400 illustrating an example embodiment of a method employed by the present disclosure. The method begins by sending a reset signal 402, which causes initialization of an input clock rotating (or recirculating) register (404) and initialization of an output clock rotating (or recirculating) register (406). As described above, the input clock rotating register receives a reset signal synchronized to the input clock and the output clock register receives a reset signal synchronized to the output clock. However, a person having ordinary skill in the art can recognize that the respective reset signals are synchronized with respect to the variable delay introduced.

The method then provides data input, synchronized to the output clock, to one of a group of mux-flops as selected by the output clock rotating register. (408). The method then forwards data input via a mux-flop to a multiplexer (410). After n cycles, where n is the number of mux-flops, and size of the rotating registers, a person having ordinary skill in the art can recognize that all of the mux-flops forward data from different cycles to the multiplexer. Then, the method selects data input as an output of the multiplexer to be the data output signal, where the selection is offset from the current cycle by n−1 cycles. (412). Then the method outputs the data output, for example using JTAG (414).

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A method comprising:
   initializing an input clock rotating register by sending a reset signal, wherein the reset signal received by the input clock rotating register is synchronized to an input clock signal;
   initializing an output clock signal via a variable delay line, the variable delay line configured to delay the input clock signal based on a number of offset cycles provided to the variable delay line;
   initializing an output clock rotating register by sending the reset signal, wherein the reset signal received by the output clock rotating register is synchronized to the output clock signal;
   providing a data input synchronized to the output clock signal to a plurality of mux-flops, wherein the output clock rotating register activates one of the plurality of mux-flops to receive the data input;
   forwarding the data input via the one of the plurality of mux-flops to a multiplexer, wherein the multiplexer is coupled to receive the outputs of the plurality of mux-flops as data inputs and wherein the input clock rotating register controls the data input selected by the multiplexer as its output; and
   selecting the data input as the output of the multiplexer to be a data output signal, such that the data output is synchronized with the input clock.

2. The method of claim 1, further comprising:
   synchronizing the reset signal to the input clock signal by routing the reset signal through a first flop that uses the input clock signal; and
   synchronizing the reset signal to the output clock signal by routing the reset signal through a second flop that uses the output clock signal.

3. The method of claim 1, wherein:
   a number of flops in the input clock rotating register and a number of flops in the output clock rotating register are equal,
   each mux-flop is coupled to be activated to receive the data input by a particular flop of the input clock rotating register, and each mux-flop is coupled to output to a particular input of the multiplexer.

4. The method of claim 1, wherein upon sending the reset signal, the input clock signal and output clock signal have a period longer than that of the reset signal, and further comprising:
   after sending the reset signal, increasing the frequency of the input clock signal and the output clock signal.

5. The method of claim 1, wherein initializing the input clock rotating register and initializing the output clock rotating register further includes:
   setting values of the output clock rotating register such that, in a given clock cycle, one mux-flop of the plurality of mux-flops receives the data input signal;
   setting values of the input clock rotating register such that, in a given clock cycle, the multiplexer outputs a value stored by a mux-flop loaded according to the number of offset cycles.

6. The method of claim 5, wherein the offset is equal to one fewer than a number of the plurality of mux-flops.

7. The method of claim 1, wherein the data output signal is provided through a Joint Test Action Group (JTAG) interface.

8. A system comprising:
   an input clock rotating register configured to be initialized by a reset signal, wherein the reset signal received by the input clock rotating register is synchronized to an input clock signal;
   an output clock rotating register configured to be initialized by the reset signal, wherein the reset signal received by the output clock rotating register is synchronized to an output clock signal, the output clock signal initialized via a variable delay line, the variable delay line configured to delay the input clock signal based on a number of offset cycles provided to the variable delay line;
   a plurality of mux-flops configured to receive a data input synchronized to the output clock signal, wherein the output clock signal rotating register activates one of the plurality of mux-flops to receive the data input; and
   a multiplexer configured to receive the data input, via the plurality of mux-flops, the multiplexer receiving a selection input of the input clock rotating register, wherein the multiplexer selects the data input as the output of the multiplexer using the selection input to be a data output signal, such that the data output is synchronized with the input clock.

9. The system of claim 8, further comprising:
   a first flop configured to synchronize the reset signal to the input clock signal by receiving the reset signal as a data input and the input clock signal as a clock input; and
   a second flop configured to synchronize the reset signal to the output clock signal by receiving the reset signal as a data input and the output clock signal as a clock input.

10. The system of claim 8, wherein:
    a number of flops in the input clock rotating register and a number of flops in the output clock rotating register are equal,
    each mux-flop is coupled to be activated to receive the data input by a particular flop of the input clock rotating register, and each mux-flop is coupled to output to a particular input of the multiplexer.

11. The system of claim 8, wherein upon sending the reset signal, the input clock signal and output clock signal have a period longer than that of the reset signal, and after sending the reset signal, the frequency of the input clock signal and the output clock signal are increased.

12. The system of claim 8, wherein initializing the input clock rotating register and initializing the output clock rotating register further includes:
    setting values of the output clock rotating register such that, in a given clock cycle, one mux-flop of the plurality of mux-flops receives the data input signal;
    setting values of the input clock rotating register such that, in a given clock cycle, the multiplexer outputs a value stored by a mux-flop loaded according to the number of offset cycles.

13. The system of claim 12, wherein the offset is equal to one fewer than a number of the plurality of mux-flops.

14. The system of claim 12, wherein the data output signal is provided through a Joint Test Action Group (JTAG) interface.

15. A non-transitory computer readable medium storing instructions thereon, the instructions, when executed by a processor, cause the processor to:

initialize an input clock rotating register by sending a reset signal, wherein the reset signal received by the input clock rotating register is synchronized to an input clock signal;

initialize an output clock signal via a variable delay line, the variable delay line configured to delay the input clock signal based on a number of offset cycles provided to the variable delay line;

initialize an output clock rotating register by sending the reset signal, wherein the reset signal received by the output clock rotating register is synchronized to an output clock signal;

provide a data input synchronized to the output clock signal to a plurality of mux-flops, wherein the output clock rotating register activates one of the plurality of mux-flops to receive the data input;

forward the data input via the one of the plurality of mux-flops to a multiplexer, wherein the multiplexer is coupled to receive the outputs of the plurality of mux-flops as data inputs and wherein the input clock rotating register controls the data input selected by the multiplexer as its output; and select the data input as the output of the multiplexer to be a data output signal, such that the data output is synchronized with the input clock.

16. The non-transitory computer readable medium of claim 15, wherein the instructions further cause the processor to:

synchronize the reset signal to the input clock signal by routing the reset signal through a first flop that uses the input clock signal; and synchronizing the reset signal to the output clock signal by routing the reset signal through a second flop that uses the output clock signal.

17. The non-transitory computer readable medium of claim 15, wherein:

a number of flops in the input clock rotating register and a number of flops in the output clock rotating register are equal, each mux-flop is coupled to be activated to receive the data input by a particular flop of the input clock rotating register, and each mux-flop is coupled to output to a particular input of the multiplexer.

18. The non-transitory computer readable medium of claim 15, wherein upon sending the reset signal, the input clock signal and output clock signal have a period longer than that of the reset signal, and further comprising:

after sending the reset signal, increasing the frequency of the input clock signal and the output clock signal.

19. The non-transitory computer readable medium of claim 15, wherein initializing the input clock rotating register and initializing the output clock rotating register further includes:

setting values of the output clock rotating register such that, in a given clock cycle, one mux-flop of the plurality of mux-flops receives the data input signal;

setting values of the input clock rotating register such that, in a given clock cycle, the multiplexer outputs a value stored by a mux-flop loaded according to the number of offset cycles.

20. The non-transitory computer readable medium of claim 19, wherein the offset is equal to one fewer than a number of the plurality of mux-flops.

\* \* \* \* \*